United States Patent [19]

Dick

[11] Patent Number: 4,819,761

[45] Date of Patent: Apr. 11, 1989

[54] TUBULAR LOUDSPEAKER SYSTEM

[76] Inventor: Roderick A. Dick, 2250 Ridgepoint #1013, Austin, Tex. 78754

[21] Appl. No.: 141,779

[22] Filed: Jan. 11, 1988

[51] Int. Cl.[4] .............. H05K 5/00

[52] U.S. Cl. .............. 181/145; 181/146; 181/151; 181/153; 181/156; 181/199; 381/158

[58] Field of Search .............. 181/144, 145, 147, 148, 181/155, 156, 199, 146, 151; 381/159, 158

[56] References Cited

U.S. PATENT DOCUMENTS

| | | | |
|---|---|---|---|
| 3,371,742 | 3/1968 | Norton et al. | 181/153 |
| 3,443,660 | 5/1969 | Virva et al. | 381/159 |
| 3,945,461 | 3/1976 | Robinson | 181/153 |
| 3,978,941 | 9/1976 | Siebert | 181/153 X |
| 3,993,162 | 11/1976 | Juuti | 181/153 X |
| 4,139,734 | 2/1979 | Fincham | 181/145 X |
| 4,616,731 | 10/1986 | Robinson | 181/148 |
| 4,655,315 | 4/1987 | Saville | 181/153 |

*Primary Examiner*—B. R. Fuller

*Attorney, Agent, or Firm*—Shlesinger & Myers

[57] ABSTRACT

A sound radiating loudspeaker and tubular enclosure combination wherein the tubular enclosure is either formed in a helical configuration or two or more straight tubular sections which interest each other at an angle. In either form the tube is capable of free standing on a supporting surface with a loudspeaker closing the upper end of the tube and angled generally toward a listening area. Also in either form, additional speakers enclosed in shorter tubes may be joined to the main tube with all speakers either in a common plane or in planes at a slight angle to one another.

10 Claims, 2 Drawing Sheets

TUBULAR LOUDSPEAKER SYSTEM

BACKGROUND OF THE INVENTION

Loudspeaker enclosures of tubular form are known in the prior art and examples may be found in any one of the following U.S. Pat. Nos.: 3,978,941, 3,443,660, 3,371,742 and 3,945,461.

Mounting loudspeakers in almost any sort of enclosure produces an improved sound quality over the same loudspeaker operating in free air. The vibrations of the loudspeaker cone produce high and low pressures at the front and rear of the cone and those to the rear of course, raise the pressure in the interior of any enclosure in which the loudspeaker is mounted. Such pressure variations in the loudspeaker enclosure produce vibrations of the enclosure material itself and the resulting sound waves which combine in the area in which the loudspeaker and enclosure are situated is what the listener eventually hears. These sympathetic vibrations of the enclosure material are often detrimental to the quality of the sound produced and the prior art is full of various attempts to eliminate the distortion of sound waves produced by unwanted vibrations from the loudspeaker enclosures. From a standpoint of ease of manufacture, most manufacturers have chosen to enclose their loudspeakers in rectangular box shaped enclosures so that there is always a wall spaced from the rear of the loudspeaker and substantially parallel to the plane of the loudspeaker cone. Also, the wall in which the loudspeaker is mounted is generally of large area compared to the area of the loudspeaker itself. Such enclosures tend to distort the radiation sound due primarily to vibrations in the walls of the enclosure and it is an object of the present invention to eliminate this source of sound distortion. Other objects are to eliminate the formation of standing waves within the enclosure and to improve imaging using a tubular loudspeaker enclosure.

BRIEF SUMMARY OF THE INVENTION

The loudspeaker enclosures of the present invention are basically tubular but they differ from those of the aforementioned prior art in that the tubes are either bent or formed of two or more tubes joined at one angle to each other. The tubes in whatever form are designed to be free-standing so that the loudspeaker will radiate sound in the general direction of the listener. Also, the geometry of the tubes is complex in order to minimize formation of standing waves. Pressure variation from rearward excursions of the loudspeaker cone are deflected so as to keep them from impeding the motion of the driver. Further, since the walls of the enclosure are circular rather than plane, the enclosure is inherently more rigid and less subject to any variation in volume from dimensional changes due to internal pressure changes caused by excursions of the loudspeaker cone.

DETAILED DESCRIPTION

Figure 1:
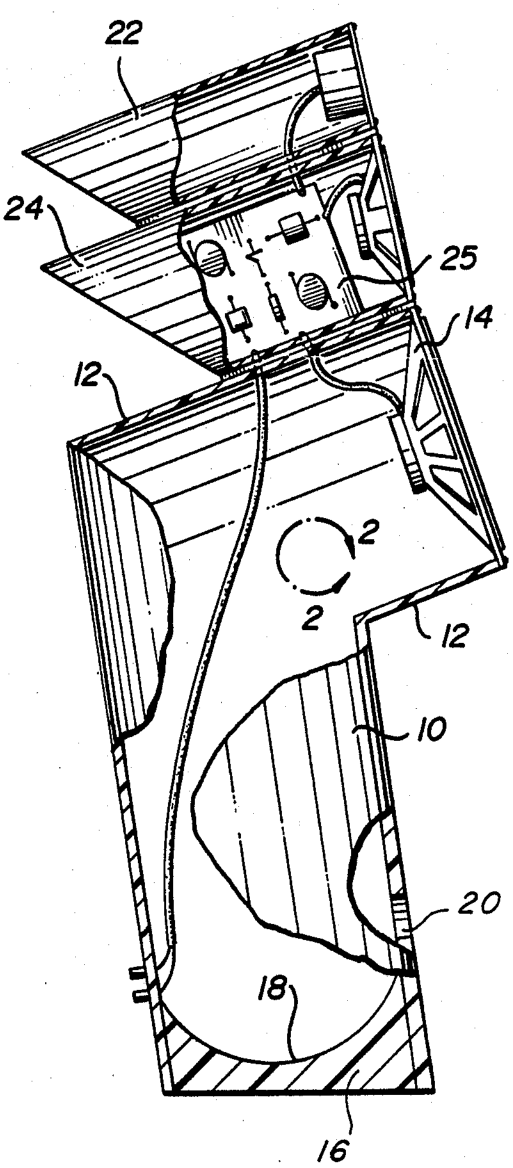
FIG. 1 is a side elevation partially in section showing a preferred embodiment of the present invention.
Figure 2:
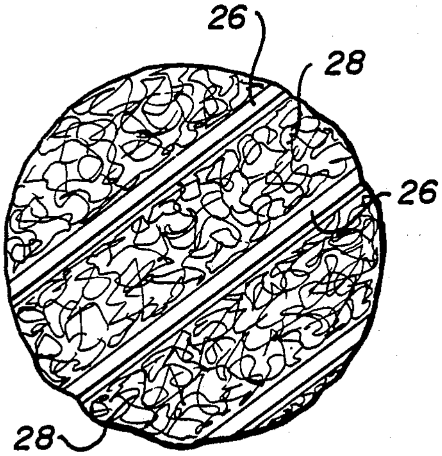
FIG. 2 is a plan view of a portion of the inner walls of the structure shown in FIG. 1 as indicated by the line 2—2.

Referring first to FIGS. 1 and 2, the preferred embodiment of the present invention includes a tubular loudspeaker enclosure having two sections 10 and 12 which intersect each other at an angle. As shown in FIG. 1, the bottom end of the section 10 is flat so that the entire structure will be free standing when placed upon any suitable supporting surface. The loudspeaker 14 is mounted in the outer end of the section 12 and closes that end of the tube. The opposite end of the tube at the lower end of the section 10 is closed with a plug 16 having an upwardly facing concave surface 18. The lower portion of the vertical section 10 preferably also includes a port 20.

For a system which includes in addition to the woofer loudspeaker 14 mounted on the main tubular enclosure, mid-range and tweeter loudspeakers, the latter loudspeakers may be mounted in auxiliary tubes 22 and 24, the axes of which lie in the same plane as the axis of the section 12 of the main tubular enclosure and all tubes are structurally rigidly joined to each other.

As indicated in FIG. 1, the planes of the high and mid-range loudspeakers may be arranged at a slight angle with respect to the loudspeaker 14. This is not essential, however, and the planes of all loudspeakers may be common.

Also as indicated in FIG. 1, a cross-over network 25 may be mounted within the tube 24.

FIG. 2, which is a partial interior view indicated by the lines 2—2 of FIG. 1, illustrates a structure of the inner side walls of the tubular sections 10 and 12 as including angularly disposed ribs 26. These ribs function to stiffen the side walls of the tube and also provide support for acoustic damping material 28 adhered to the inner tube walls.

Figure 3:
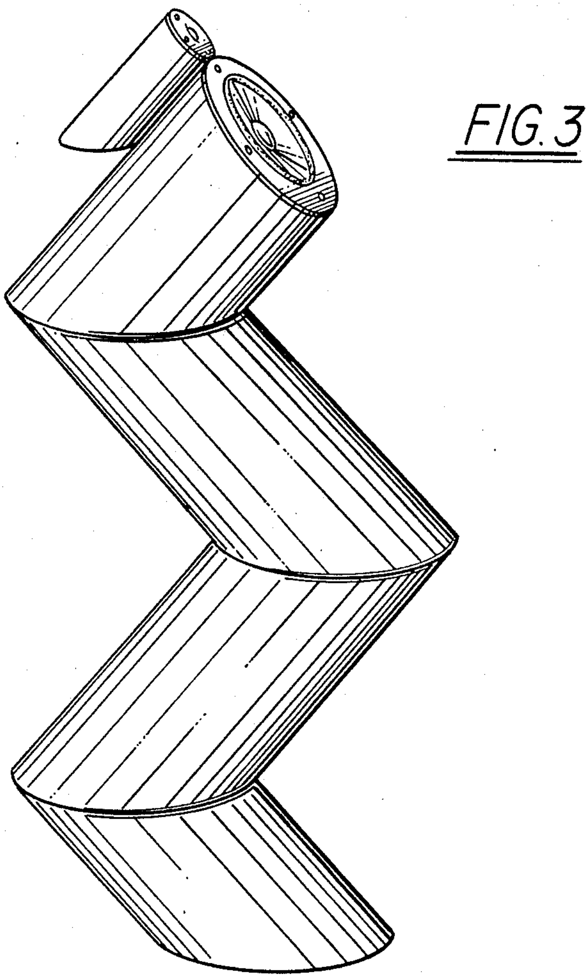
FIG. 3 is a perspective view of a first alternative embodiment.

While FIGS. 1 and 2 represent a preferred embodiment of the present invention, the two section tube arrangement of these figures may be replaced with a multiple section tube of substantially zig-zag configuration as shown in FIG. 3. Here again, the overall structure may include only one loudspeaker or a plurality of loudspeakers as illustrated in FIG. 1.

Figure 4:
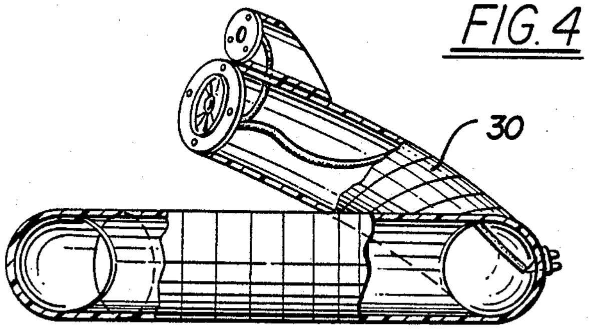
FIG. 4 is a view similar to FIG. 1 showing a second alternative embodiment.

A further possible configuration of the tubular enclosure is illustrated in FIG. 4 where the tube 30 is formed substantially in a helical configuration of slightly less than one turn. The number of turns, however, is not critical and may be varied to accommodate the required volume for any particular loudspeaker. Also, as in the case of FIG. 1, additional loudspeakers and tubular enclosures may be added to the main tube 30 of FIG. 4 as desired and the plane of the various loudspeakers may either be common or the loudspeakers may lie in two or more different planes.

While preferred embodiments of the present invention have been herein shown and described, applicant claims the benefit of a full range of equivalents within the scope of the appended claims.

I claim:

1. A loudspeaker-enclosure combination comprising:

(a) at least first and second loudspeakers, the first having a lower frequency response and a larger outer dimension than the second;

(b) at least first and second hollow tubes having inner dimensions which correspond substantially to the outer dimensions of said first and second loudspeakers respectively, said first tube including upper and lower portions which lie in different planes, said second tube being attached along an outer surface of said upper portion of said first tube, with one end of said second tube substantially parallel to an outer end of said upper portion of said first tube;

(c) means closing an outer end of said lower portion of said first tube;

(d) means mounting said first and second loudspeakers in said outer end of said upper portion of said first tube and said one end of said second tube respectively, said loudspeakers facing outwardly of said tubes; and (e) means defining a port adjacent the closed end of said lower portion of said first tube.

2. The combination defined by claim 1 in which said first tube is formed in a substantially helical configuration.

3. The combination defined by claim 1 in which said first tube is formed in a substantially helical configuration of less than one turn.

4. The combination defined by claim 1 in which the upper and lower portions of said first tube intersect at an angle to form a substantially "7" shaped structure.

5. The combination defined by claim 1 in which an inner surface of said first tube is lined with an acoustic damping material.

6. The combination defined by claim 1 in which an inner surface of said first tube includes a plurality of longitudinally extending stiffening ribs.

7. The combination defined by claim 6 in which a sound damping material is nestled between said ribs and adhered to the inner surface of said first tube.

8. The combination defined by claim 1 in which said first tube includes a plurality of sections intersecting each other in a zig-zag configuration.

9. The combination defined by claim 1 including an electrical cross over network mounted within said second first tube.

10. A loudspeaker-enclosure combination, as in claim 1, wherein:

(a) said closing means includes an inner concave surface.

* * * * *